(12) United States Patent
Kato et al.

(10) Patent No.: US 7,330,770 B2
(45) Date of Patent: Feb. 12, 2008

(54) FAN SELECTION METHOD AND FAN SELECTION DEVICE

(75) Inventors: Akira Kato, Tokyo (JP); Kinshi Ito, Kanagawa (JP)

(73) Assignee: Sanyo Denki Co., Ltd., Tokyo (JP)

( * ) Notice: Subject to any disclaimer, the term of this patent is extended or adjusted under 35 U.S.C. 154(b) by 16 days.

(21) Appl. No.: 11/389,865

(22) Filed: Mar. 27, 2006

(65) Prior Publication Data

US 2006/0225481 A1  Oct. 12, 2006

(30) Foreign Application Priority Data

Mar. 28, 2005  (JP)  ............... 2005-091581

(51) Int. Cl.
- G06F 19/00 (2006.01)
- G05D 23/00 (2006.01)
- G05D 16/00 (2006.01)

(52) U.S. Cl. ............... 700/97; 700/299; 700/300; 361/695

(58) Field of Classification Search ........ 700/281, 700/282, 299, 300; 73/1.01; 361/695
See application file for complete search history.

(56) References Cited

U.S. PATENT DOCUMENTS 6,920,797 B1 * 7/2005 Wang .................. 73/861

FOREIGN PATENT DOCUMENTS

| JP | 2003-037367 | * 2/2003 |
|---|---|---|
| JP | 2004-246728 | 9/2004 |

* cited by examiner

Primary Examiner—Kidest Bahta
Assistant Examiner—Nate Laughlin
(74) Attorney, Agent, or Firm—Rankin, Hill, Porter & Clark LLP

(57) ABSTRACT

To provide a fan selection device capable of selecting a fan using a small amount data prepared in advance and also using simple computations. A required ventilation flow quantity is computed by computing means 4 when predicted total electric power consumption and a predicted air temperature rise are entered into a predetermined computational expression. Parameter range determining means 5 determines a parameter range of a proper flow quantity ratio necessary for cooling. Required flow quantity computing means 7 computes a minimum required flow quantity and a maximum required flow quantity by dividing the required ventilation flow quantity by the upper and lower limit values of the parameter range of the proper flow quantity ratio, respectively. Selection means 8 searches for a fan that produces the maximum flow quantity necessary for obtaining a flow quantity that falls between the minimum required flow quantity and the maximum required flow quantity, from a database 9, and selects the fan as the required fan.

11 Claims, 10 Drawing Sheets

(A) Ambient temperature (Maximum air temperature around housing) [35] [°C]

(B) Allowable temterature within housing [45] [°C]

(C) Amount of heat generated within housing [300] [W ▼]

Generated heat amount computing tool

(D) Fan settings
- Supply voltage [DC12V ▼]
- Frame size [120mm ▼]
- Frame type [Unspecified ▼]
- Material [Unspecified ▼]
- Fan type [Specified to be water resistant (DC Fan) ▼]

(E) Number of fans mounted in parallel [2 ▼]

(F) Emissivity of housing surface [35]

(G) Height of housing [500] [mm ▼]

(H) Depth of housing [500] [mm ▼]

(I) Width of housing [450] [mm ▼]

(J) Air vent area of housing [1100] [mm ▼]

(K) State of ventilation in housing:
- ☐ Component density within housing is high, and no allwance is provided for ventilation.
- ☐ Filter is attached to fan.
- ☐ Distance between air vent of fan and wall surface of housing is near.

[Execution of selection]

Result of fan selection

| Condition setting item | Input value | Computation item for selection | Computed value |
|---|---|---|---|
| (A) Maximum air temperature around housing | 35°C | (a) Amount of heat emitted by convection from surface of housing | 25.57W |
| (B) Allowable air temperature within housing | 45°C | (b) Amount of heat emitted by radiation from surface of housing | 15.31W |
| (C) Amount of heat generated within housing | 300W | (c) Required amount of heat emitted by forced ventilation | 259.12W |
| (D) Fan/Frame size | 120mm | (d) Required flow quantity by forced ventilation | 1.35m³/min |
| (E) Number of fans mounted in parallel | One unit | (e) Required flow quantity per fan | 1.35m³/min |
| (F) Emissivity of housing surface | 0.8 | (f) Sectional area of fan (total sectional areas of fans) | 14400.00mm² |
| (G) Height of housing | 300mm | (g) Air vent area/sectional area of fan | 0.055 |
| (H) Depth of housing | 400mm | (h) Flow quantity setting range parameter (Upper limit) | 0.50 |
| (I) Width of housing | 500mm | (i) Flow quantity setting range parameter (Lower limit) | 0.35 |
| (J) Air vent area of housing | 1000mm² | (j) Flow rate for fan selection (Upper limit value) | 3.86m³/min |
| (K) State of ventilation of housing (number of check marks) | Two marks | (k) Flow quantity for fan selection (Lower limit value) | 2.70m³/min |

Catalog display

FIG.7

Water-resistant fan A (120W)

| Type | Rated voltage (V) | Rated current (A) | Rated input (W) | Rated number of revolutions (min-1) |
|---|---|---|---|---|
| AAA-0001 | DC 12V | 0.4 | 4 | 2850 |

| Mximum flow quantity (m³/min) | Maximum static pressure (Pa) | Sound pressure level (dB[A]) | Mass (g) |
|---|---|---|---|
| 3.0 | 70.5 | 41 | 420 |

Water-resistant fan B (120W)

| Type | Rated voltage (V) | Rated current (A) | Rated input (W) | Rated number of revolutions (min-1) |
|---|---|---|---|---|
| BBB-0001 | 25.57W | 0.61 | 7 | 3100 |

| Mximum flow quantity (m³/min) | Maximum static pressure (Pa) | Sound pressure level (dB[A]) | Mass (g) |
|---|---|---|---|
| 3.34 | 100.0 | 46 | 410 |

FIG.8

Water-resistant fan A (120W)

| Type | Rated voltage (V) | Rated current (A) | Rated input (W) | Rated number of revolutions (min-1) |
|---|---|---|---|---|
| AAA-0001 | DC 12V | 0.4 | 4 | 2850 |

| Mximum flow quantity (m³/min) | Maximum static pressure (Pa) | Sound pressure level (dB[A]) | Mass (g) |
|---|---|---|---|
| 3.0 | 70.5 | 41 | 420 |

To purchase product ⇒ To purchase form

Water-resistant fan B (120W)

| Type | Rated voltage (V) | Rated current (A) | Rated input (W) | Rated number of revolutions (min-1) |
|---|---|---|---|---|
| BBB-0001 | 25.57W | 0.61 | 7 | 3100 |

| Mximum flow quantity (m³/min) | Maximum static pressure (Pa) | Sound pressure level (dB[A]) | Mass (g) |
|---|---|---|---|
| 3.34 | 100.0 | 46 | 410 |

To purchase product ⇒ To purchase form

FIG.9

Result of fan selection

| Condition setting item | Input value | Computation item for selection | Computed value |
|---|---|---|---|
| (A) Maximum air temperature around housing | 35°C | (a) Amount of heat emitted by convection from surface of housing | 25.57W |
| (B) Allowable air temperature within housing | 45°C | (b) Amount of heat emitted by radiation from surface of housing | 15.31W |
| (C) Amount of heat generated within housing | 300W | (c) Required amount of heat emitted by forced ventilation | 259.12W |
| (D) Fan/Frame size | 120mm | (d) Required flow quantity by forced ventilation | 1.35m³/min |
| (E) Number of fans mounted in parallel | One unit | (e) Required flow quantity per fan | 1.35m³/min |
| (F) Emissivity of housing surface | 0.8 | (f) Sectional area of fan (total sectional areas of fans) | 14400.00mm² |
| (G) Height of housing | 300mm | (g) Air vent area/sectional area of fan | 0.055 |
| (H) Depth of housing | 400mm | (h) Flow quantity setting range parameter (Upper limit) | 0.50 |
| (I) Width of housing | 500mm | (i) Flow quantity setting range parameter (Lower limit) | 0.35 |
| (J) Air vent area of housing | 1000mm² | (j) Flow rate for fan selection (Upper limit value) | 3.86m³/min |
| (K) State of ventilation of housing (number of check marks) | Two marks | (k) Flow quantity for fan selection (Lower limit value) | 2.70m³/min |

Appropriate fan could not be found.
Sectional area of air vent is too small.

Input conditions again  To input screen

FIG.10

Computation of surface area
 Top surface area of housing    S1
 Vertical surface area of housing    S2
 Bottom surface area of housing    S3
 S = S1 + S2 + S3

Allowable air temperature rise value
 $\Delta t_a = T_a - T_\infty$

Computation of required flow quantity
 $P = (2.8S1 + 2.2S2 + 1.5S3) \times (\Delta t_a/2)^{1.25}$
 $+ \sigma \varepsilon S1[(\Delta t_a/2 + T_\infty + 273.15)^2 + (T_\infty + 273.15)^2]$
 $\times [\Delta t_a/2 + T_\infty + 273.15) + (T_\infty + 273.15)] \times (\Delta t_a/2)$
 $+ 1150 Q_v \Delta T_a$ Computation of required flow quantity range for
 R<0.25           Selection range parameter (PM1~PM2)  : 0.35~0.5
 0.25≦R<0.5   Selection range parameter (PM1~PM2)  : 0.5~0.667
 0.5≦R<0.75  Selection range parameter (PM1~PM2)  : 0.667~0.75
 0.75≦           Selection range parameter (PM1~PM2)  : 0.75~0.95

Determination of maximum flow quantity
 Qmax = Qv/PM1
 Qmin = Qv/PM2

Fan selection
 Qmin/n < Maximum flow quantity < Qmax/n

FAN SELECTION METHOD AND FAN SELECTION DEVICE

BACKGROUND OF THE INVENTION

The present invention relates to a fan selection method and a fan selection device for selecting a fan required for use in cooling an inside space of a housing with an electric device that generates heat included therein.

Japanese Patent Application Laid-Open Publication No. 246728/2004 discloses a method and a system for computing a proper level of each of a plurality of fans having different performances when mounted in an electronic device based on fan data, and determining ranking of fan candidates to be mounted in the electronic device based on a parameter for each of the fans obtained by this computation. Specifically, specifications covering an amount of heat in a heating element within the electronic device, an allowable temperature rise value of a housing that includes the electronic device, and the like are first determined. Next, a required flow quantity of the fan for cooling an internal temperature of the housing to within an allowable temperature is computed. When the required flow quantity is computed, no particular consideration is given to the size of an air vent provided at the housing. Then, PQ curves each indicating a static pressure and a flow quantity of each fan and output curves of the fans are plotted. When the PQ curves and the output curves are plotted, a ventilation resistance is determined from each PQ curve, an impedance curve for the device including each of the fans is plotted from this ventilation resistance, and then the operating point of each fan is determined from the impedance curve and the PQ curve. If a ventilation resistance when each fan is operated matches the ventilation resistance of the housing of the electric device, it is determined that the fan operates in the electronic device with no problem. Then, from each plotted output curve, the flow quantity at the time of the maximum output of each fan is computed as the parameter. Finally, the required flow quantity is compared with the flow quantity at the time of the maximum output of each fan, thereby selecting a fan to be mounted in the electric device.

In a conventional technique, based on the plotted curves, a designer himself can see why the unselected fans have not been set. In the conventional technique, however, no particular consideration is given to the size of the air vent at the housing. Thus, a housing structure difference may cause an error in the fan selection. Further, in order to plot the static pressure-flow quantity curve or the PQ curve and the output curve, detailed data on each of the fans needs to be prepared. Further, specifically, a rather complicated computation such as the computation for obtaining the impedance curve for the electric device including each of the fans is required. For this reason, in the conventional technique, it is necessary for the designer of the electronic device to determine design conditions in detail. As described above, in the conventional technique, the data on the fans must be prepared in advance in detail, and it needs time and effort to perform inputting or updating of the fan data. Further, since the complicated computation is necessary for the fan selection and plotting the PQ curves, output curves, and impedance curve, the fan selection cannot be performed readily. In the conventional technique, unless some conditions about the fan selection have been determined, the fan selection cannot be performed readily.

SUMMARY OF THE INVENTION

An object of the present invention is therefore to provide a fan selection method and a fan selection device capable of selecting a fan using a small amount of data prepared in advance and using simple computations, and a program used in these method and device.

Other object of the present invention is to provide a fan selection method and a fan selection device in which in view of a housing structure for an electric device, without requiring analysis for obtaining the impedance curve of an electric device that includes a fan, fan selection can be readily performed.

Another object of the present invention is to provide a fan selection method and a fan selection device that can readily select a fan even under an insufficient condition.

In a fan selection method of the present invention, a fan required for use in cooling an inside space of a housing is selected. The housing includes therein an electric device that generates heat. The method is constituted by a preparation step, a computation step, a parameter range determination step, and a selection step. First, at the preparation step, parameter data and a database for fan data are prepared. The parameter data shows a change in a flow quantity ratio between an effective flow quantity $Q_1$ when a fan is operated and a maximum flow quantity $Q_0$ of the fan when an area ratio $S_1/S_2$ between an opening area $S_1$ of an air vent provided at the housing and a sectional area $S_2$ of an air flow passage of the fan is changed. The effective flow quantity $Q_1$ means the flow quantity at which actual air blowing can be performed, while the maximum flow quantity $Q_0$ means the flow quantity that can be achieved by performance of the fan. The fan data includes the maximum flow quantity $Q_0$ on a plurality of usable fans. In the present invention, the fan data on at least the maximum flow quantity $Q_0$ should be provided in the database. The "air vent" herein mean outside air inlet openings, provided at the housing targeted for cooling in order to obtain a ventilation effect by the fan. Alternatively, the "air vent" mean all of the outside air inlet openings or inside air discharge openings excluding an air hole provided at the housing for mounting the fan. Accordingly, the "opening area of the air vent of the housing" is obtained by subtracting the area of the air hole for mounting the fan from the total value of the opening areas of all the air vents provided at the housing. Further, the "sectional area of the air flow passage of the fan" is exactly defined to the sectional area of an airflow opening around which an impeller with blades rotates. When a plurality of fans are used, the sectional area of the air flow passages of the fans will become the total value of the sectional areas of airflow openings of the fans. For convenience in writing, however, the sectional area of a frame for the fan (sectional area of an opening for mounting the fan) may be regarded as the sectional area of the air flow passage of the fan. When a plurality of fans are used, the total value of the sectional areas of frames for the fans planned for use will be regarded as the sectional area of the air flow passages of the fans. According to a study by the inventor of the present invention, it has been found that between the area ratio $S_1/S_2$ and the flow quantity ratio between the effective flow quantity $Q_1$ when a fan is operated and the maximum flow quantity $Q_0$ of the fan, there is a relative relationship, regardless of the size of the housing. More specifically, the inventor has found that the larger the area ratio becomes, the larger the flow quantity ratio becomes. The smaller the area ratio becomes, the smaller the flow quantity ratio becomes. Then, the inventor has found that by utilizing this relationship, fan selection can be performed, without performing complicated computation and without preparing much fan data.

Then, in the present invention, by entering predicted total electric power consumption of the electric device and a predicted air temperature rise within the housing into a predetermined computational expression, a required ventilation flow quantity is first computed at the computation step. This computational expression shows a relationship among total electric power consumption P of the electric device, a rise in the temperature of air within the housing $\Delta Ta$ when cooling is not performed, and a necessary ventilation flow quantity Qv required for the cooling. As an example of the computational expression, $P=1150 \cdot Qv \cdot \Delta Ta$, for example, can be employed. This expression is obtained from a heat calculation. The present invention, however, is not limited to a case where only this expression is employed.

At the parameter range determination step, the area ratio between the opening area of the air vent provided at the housing planned for use and the sectional area of the air flow passage of the fan planned for use is obtained. Then, from this area ratio and the parameter data described above, the parameter range of a proper flow quantity ratio necessary for cooling is determined. When the area ratio is considered to belong to a region of a certain width having a plurality of area ratios, for example, the parameter range of the proper flow quantity ratio will be determined according to an upper limit flow quantity value and a lower limit flow quantity value of the region corresponding to an upper limit area ratio value and a lower limit area ratio value of the region, respectively. The region with the area ratios is set so that the parameter range of the proper flow quantity ratio required for cooling is determined in view of the maximum flow quantity of the fans targeted for use.

At the selection step, a required minimum flow quantity $Q_{min}$ obtained by dividing the required ventilation flow quantity by the upper limit value of the parameter range of the proper flow quantity and a required maximum flow quantity $Q_{max}$ obtained by dividing the required ventilation flow quantity by the lower limit value of the parameter range of the proper flow quantity are obtained. Then, the fan that produces the maximum flow quantity $Q_0$ required for obtaining the flow quantity that falls between the required minimum flow quantity $Q_{min}$ and the required maximum flow quantity $Q_{max}$, is searched from the database and selected as the required fan. Incidentally, when n (n being an integer of two or more) fans are employed, the n fans, each of which produces a maximum flow quantity $Q_0/n$, will be selected. As described above, in the present invention, using the lower and upper limit values of the parameter range of the proper flow quantity ratio, the required minimum flow quantity $Q_{min}$ and the required maximum flow quantity $Q_{max}$ are determined. Then, the fan which can produce the maximum flow quantity $Q_0$ that falls between the required minimum flow quantity $Q_{min}$ and the required maximum flow quantity $Q_{max}$ is selected. Thus, fan selection can be performed using a small amount of data prepared in advance and also using only simple computations.

At the computation step, as the predicted total electric power consumption, a corresponding electric power value obtained by converting the amount of heat emitted by convection from the surface of the housing planned for use to electric power and/or a corresponding electric power value obtained by converting the amount of heat emitted by radiation from the surface of the housing planned for use to electric power are/is added to a converted electric power value obtained by converting the amount of heat to be cooled by the fan to electric power. Then, computation accuracy will be increased. In order to obtain the amounts of heat emitted by convection and radiation from the surface of the housing, dimensional data on the housing and emissivity data on the surface of housing become necessary. When these data is used to compute the total electric power consumption of the electric device at the computation step, the following expression, for example, can be used.

$$P=(2.8S_{TOP}+2.2S_{SIDE}+1.5S_{BOT}) \times (\Delta Ta/2)^{1.25}+\sigma \epsilon S_{TOT}$$
$$[(\Delta Ta/2+T\infty+273.15)^2+(T\infty+273.15)^2] \times [(\Delta Ta/2+T\infty+273.15)+(T\infty+273.15)] \times (\Delta Ta/2)+$$
$$1150 \cdot Qv \cdot \Delta Ta$$

In the above expression, $S_{TOP}$ indicates the surface area of a top surface of the housing, $S_{SIDE}$ indicates the surface area of a vertical surface of the housing, $S_{BOT}$ indicates the surface area of a bottom surface of the housing, $S_{TOT}$ indicates the surface area of total surfaces of the housing, $\Delta Ta$ indicates a rise in the internal air temperature of the housing, Ta indicates the internal air temperature of the housing ($\Delta Ta$+ambient air temperature), and $T\infty$ indicates the ambient air temperature (outside air temperature) of the housing, and $\sigma$ indicates a Stefan-Boltzman constant ($=5.67 \times 10^{-8}$). $\epsilon$ indicates emissivity on the surface of the housing, while Qv indicates the required ventilation flow quantity. The unit of length is the millimeter, the unit of temperature is the Centigrade degree, and the unit of flow quantity is $m^3/s$.

The corresponding electric power value for the amount of heat emitted by convection from the surface of the housing is computed by the first term of this expression. The corresponding electric power value for the amount of heat emitted by radiation from the surface of the housing is computed by the second term of this expression. When dimensions of the housing are not all given, computation of the first term should be ignored. When the emissivity of the surface of the housing is not known, the expression of the second term should be ignored.

At the parameter range determination step, a state of good ventilation within the housing planned for use is set to a coefficient of 1. When the state of ventilation becomes worse, the coefficient is reduced. Then, based on a value obtained by multiplying the coefficient by the area ratio according to the state of ventilation, the range of the proper flow quantity ratio is determined. With regard to the state of ventilation within the housing planned for use, a plurality of adverse conditions that deteriorate the state of ventilation within the housing planned for use are listed in advance. Then, according to how many adverse conditions the housing suffers, the level of ventilation in the housing is changed. When one adverse condition is included, the coefficient becomes 0.9, which is obtained by subtracting 0.1 from 1. When two adverse conditions are included, the coefficient becomes 0.8, which is obtained by subtracting 0.1×2 from 1. The coefficient is thus reduced according to the state of ventilation. With this arrangement, computations in view of the state of ventilation are performed. The accuracy of the computations is thereby increased.

When the area ratio between the opening area of the air vent provided at the housing planned for use and the sectional area of the air flow passage of a fan planned for use is unknown at the parameter range determination step, the parameter range that is standard and predetermined can be employed. Though a manner in which this standard parameter range is determined is arbitrary, it is preferable to determine the standard parameter range with reference to general design criteria When selection of the appropriate fan cannot be performed at the selection step, a notification step for notifying a reason for this may be further performed. With this arrangement, the reason why the appropriate fan cannot be selected can be known. Thus, it becomes easy to change conditions for the fan selection and perform another fan selection.

A fan selection device of the present invention for selecting a fan required for use in cooling an inside space of a housing, the housing including therein an electric device that generates heat, can be constituted by parameter data storage means; a database; input means; computing means; parameter range determining means; required flow quantity computing means; and selection means. The parameter data storage means stores parameter data indicating a change in a flow quantity ratio between an effective flow quantity $Q_1$ and a maximum flow quantity $Q_0$ of the fan when an area ratio $S_1/S_2$ of an opening area $S_1$ of an air vent provided at the housing to a sectional area $S_2$ of an air flow passage at the fan is changed. The effective flow quantity $Q_1$ indicates the effective flow quantity when the fan is operated.

The database stores fan data including the maximum flow quantity $Q_0$ on a plurality of usable fans. The input means is used for inputting a condition for the selection. The computing means computes a required ventilation flow quantity when predicted total electric power consumption of the electric device and a predicted air temperature rise within the housing are entered into a computational expression indicating a relation among total electric power consumption of the electric device, a rise in an air temperature within the housing when the cooling is not performed, and the required ventilation flow quantity necessary for the cooling. The parameter range determining means obtains the area ratio $S_1/S_2$ between the opening area $S_1$ of the air vent provided at the housing planned for use and the sectional area $S_2$ of the air flow passage of the fan planned for use, and determines from the area ratio $S_1/S_2$ and the parameter data a parameter range of a proper flow quantity ratio required for the cooling. Then, the required flow quantity computing means computes a required minimum flow quantity $Q_{min}$ and a required maximum flow quantity $Q_{max}$. The minimum required flow quantity $Q_{min}$ is obtained by dividing the required ventilation flow quantity by an upper limit value of the parameter range of the proper flow quantity. The maximum required flow quantity $Q_{max}$ is obtained by dividing the required ventilation flow quantity by a lower limit value of the parameter range of the proper flow quantity. The selection means searches for the fan that produces the maximum flow quantity $Q_0$ necessary for obtaining the flow quantity that falls between the required minimum flow quantity $Q_{min}$ and the required maximum flow quantity $Q_{max}$, computed by the required flow quantity computing means from the database and selects the fan as the required fan. When selection of the appropriate fan cannot be performed at the selection step, notification means for notifying a reason therefor is provided.

A program used when the present invention is implemented by a computer includes the following functions: the function of allowing parameter data and a database for fan data to be used, the parameter data indicating a change in a flow quantity ratio between an effective flow quantity $Q_1$ and a maximum flow quantity $Q_0$ of a fan when an area ratio of an opening area $S_1$ of an air vent provided at a housing to a sectional area $S_2$ of an air flow passage at the fan is changed, the effective flow quantity $Q_1$ indicating the effective flow quantity when the fan is operated, the fan data including a maximum flow quantity $Q_0$ on a plurality of usable fans; the function of computing a required ventilation flow quantity by entering into a computational expression predicted total electric power consumption of the electric device and a predicted air temperature rise within the housing, the computational expression indicating a relation among total electric power consumption of the electric device, a rise in an air temperature within the housing when cooling is not performed, and the required ventilation flow quantity necessary for the cooling; the function of obtaining the area ratio $S_1/S_2$ between the opening area $S_1$ of the air vent provided at the housing planned for use and the sectional area $S_2$ of the air flow passage of the fan planned for use, and determining from the area ratio $S_1/S_2$ and the parameter data a parameter range of a proper flow quantity ratio required for the cooling; and the function of searching for the fan that produces the maximum flow quantity $Q_0$ necessary for obtaining a flow quantity that falls between a required minimum flow quantity $Q_{min}$ and a required maximum flow quantity $Q_{max}$ from the data base and selecting the fan as the required fan, the required minimum flow quantity $Q_{min}$ being obtained by dividing the required ventilation flow quantity by an upper limit value of the parameter range of the proper flow quantity ratio, the required maximum flow quantity $Q_{max}$ being obtained by dividing the required ventilation flow quantity by a lower limit value of the parameter range of the proper flow quantity ratio.

According to the present invention, fan selection can be performed using a small amount of data prepared in advance and also using only simple computations.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF PREFERRED EMBODIMENT

Figure 1:
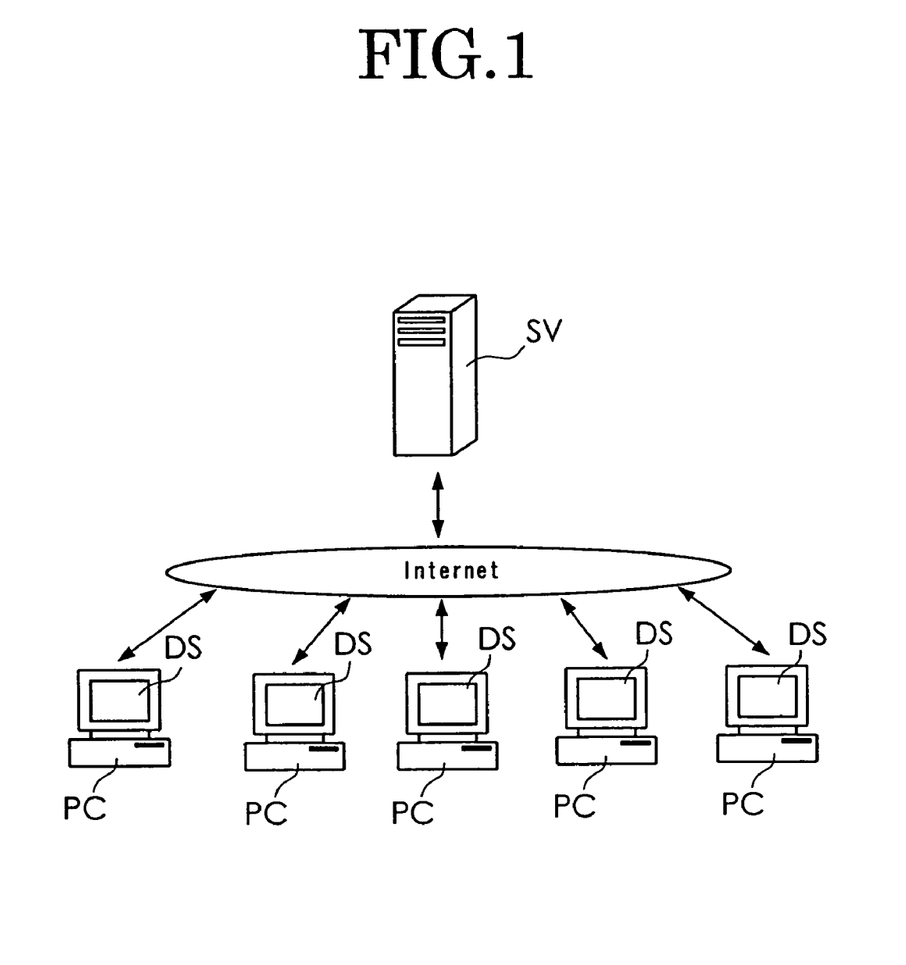
FIG. 1 is a diagram showing a configuration when a fan selection device of the present invention that carries out a method of the present invention is implemented using a personal computer PC of each client connected to a network as a terminal device.
Figure 2:
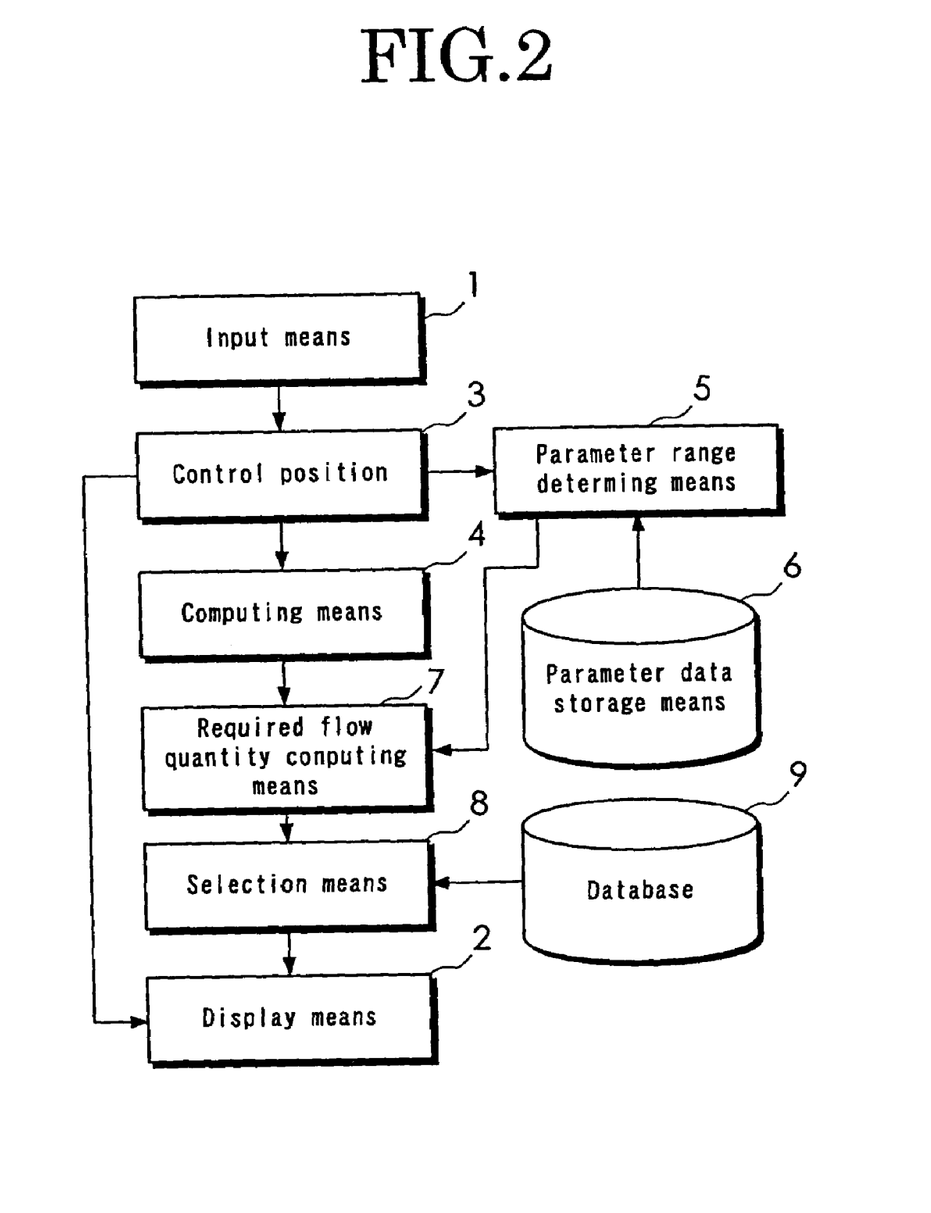
FIG. 2 is a block diagram showing a configuration of the fan selection device in an embodiment of the present invention.
Figure 3:
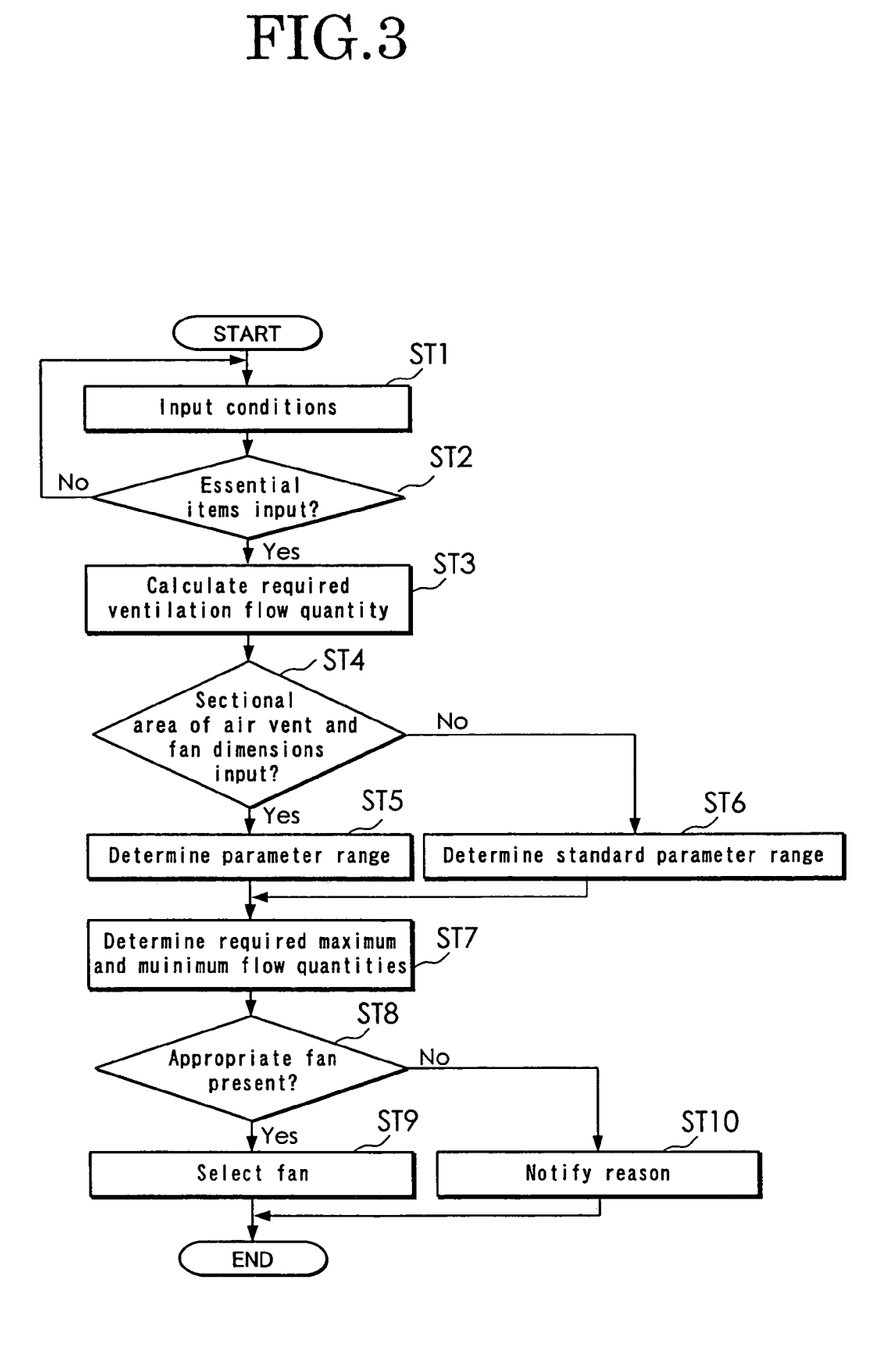
FIG. 3 is a flowchart showing an algorithm of a program used when each means to be constructed within a server SV in FIG. 1 is constructed within the server SV.
Figure 4:
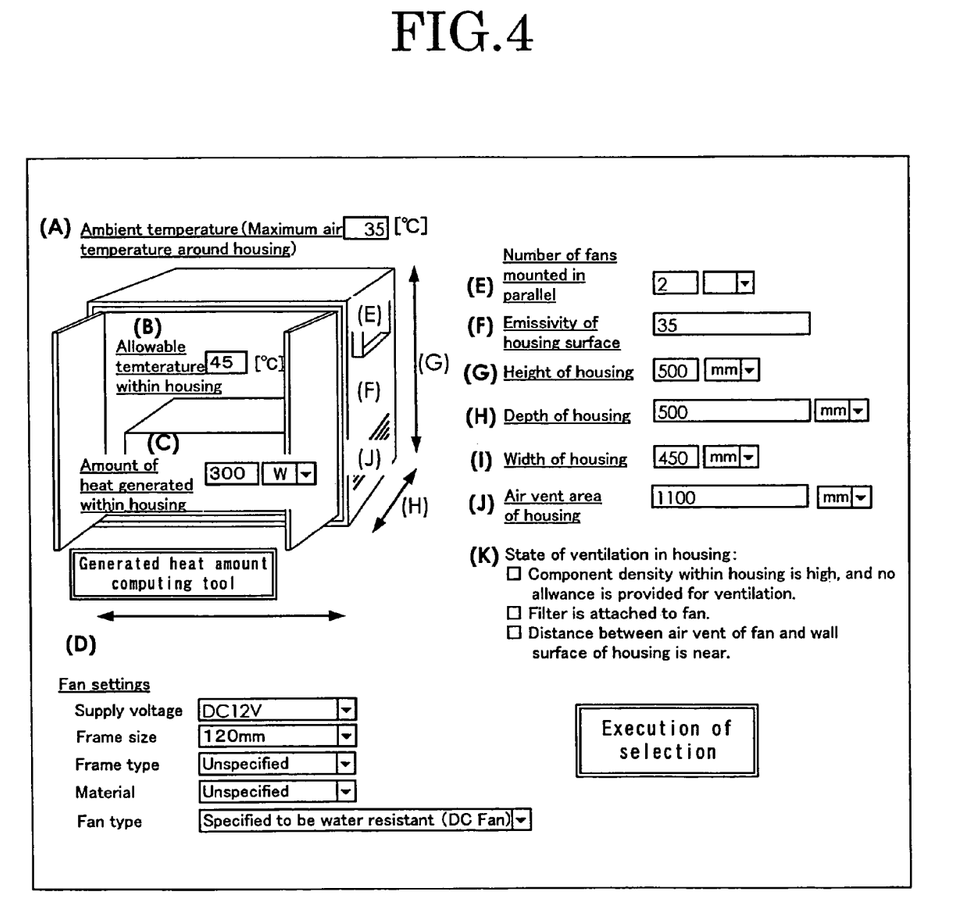
FIG. 4 is a diagram showing an example of an input display screen to be displayed on display means when a condition for selecting a fan is input through input means.

An embodiment of the present invention will be described below in detail with reference to drawings. FIG. 1 shows a configuration when a fan selection device of the present invention for carrying out a method of the present invention is implemented using a personal computer PC of each client connected to a network as a terminal device. Inside a server SV, a main portion of the fan selection device of the present invention for carrying out the method of the present invention is included. FIG. 2 is a block diagram showing a configuration of the embodiment in which the personal computer PC as the terminal device is used as input means 1 such as a keyboard and a mouse that are not shown and display means 2 constituted by a display DS, and other means are constructed within the server SV. The personal computer PC makes access to the server SV, thereby performing required screen display on the display means 2 constituted by the display DS. Within the server SV, a control portion 3, computing means 4, parameter range determining means 5, parameter and data storage means 6, required flow quantity computing means 7, selection means 8, and a database 9 are constructed. FIG. 3 is a flowchart showing an algorithm for a program used when each means to be constructed within the server SV in FIG. 1 is constructed within the server SV. FIG. 4 displays an input display screen to be displayed on the display means 2 when a condition for selecting a fan is input through the input means 1. This input display screen is displayed on the display screen of the display means 2 based on a command from the control portion 3. Incidentally, image data on the display screen is stored within the database 9.

As shown in FIG. 4, in this embodiment, (A) ambient temperature (maximum air temperature around a housing), (B) allowable temperature within the housing, (C) an amount of heat generated in the housing (which is a value obtained by converting the amount of heat of an electric device inside the housing to an amount of electric power), (D) fan settings (including a supply voltage and a frame size of, a frame thickness of, a material of, and a type of a fan), (E) the number of fans mounted in parallel, (F) emissivity of the surface of the housing (G) height of the housing (H) depth of the housing (I) width of the housing, (J) area of an air vent at the housing, and (K) a housing ventilation condition become input conditions. In this embodiment, however, even if all of these conditions are not input, fan selection is possible. Essential items as the input conditions are (A) the ambient temperature, (B) the allowable temperature within the housing, (C) the amount of heat generated in the housing, and (D) the number of the fans mounted.

A description will be given below, provided that all the conditions described above are input through the input means 1. When the conditions are input to condition entry fields shown in FIG. 4, and then when an icon for executing selection is clicked, selection processing is started. Initially, the computing means 4 computes a required ventilation flow quantity Qv when total predicted electric power consumption of the electric device arranged inside the housing and a predicted air temperature rise in the housing (obtained by subtracting the ambient temperature of the housing from the allowable temperature within the housing) are entered into the following computational expression through the input means, the computing means 4 computes a required ventilation flow quantity Qv. This computational expression shows a relation among total electric power consumption P of the electric device, a rise in the temperature of air within the housing when cooling is not performed, and a necessary ventilation flow quantity required for the cooling. When all the conditions are input, a corresponding electric power value obtained by converting an amount of heat emitted by convection from the surface of the housing planned for use to electric power and a corresponding electric power value obtained by converting an amount of heat emitted by radiation from the surface of the housing planned for use to electric power are added to a converted electric power value (the amount of heat generated in the housing) obtained by converting an amount of heat to be cooled by a fan to electric power. Then, this value is used as the total predicted electric power consumption P. The expression to be used in this case is as follows:

$$P = (2.8 S_{TOP} + 2.2 S_{SIDE} + 1.5 S_{BOT}) \times (\Delta T a/2)^{1.25} + \sigma \epsilon S_{TOT} [(\Delta T a/2 + T\infty + 273.15)^2 + (T\infty + 273.15)^2] \times [(\Delta T a/2 + T\infty + 273.15) + (T\infty + 273.15)] \times (\Delta T a/2) + 1150 \cdot Qv \cdot \Delta T a$$

In the above expression, $S_{TOP}$ indicates the surface area of a top surface of the housing, $S_{SIDE}$ indicates the surface area of a vertical surface of the housing, $S_{BOT}$ indicates the surface area of a bottom surface of the housing, $S_{TOT}$ indicates the surface area of total surfaces of the housing, $\Delta Ta$ indicates a rise in the internal air temperature of the housing, Ta indicates the internal air temperature of the housing ($\Delta Ta$+the ambient air temperature), and $T\infty$ indicates the ambient air temperature of the housing, and $\sigma$ indicates a Stefan-Boltzman constant ($=5.67 \times 10^{-8}$). $\epsilon$ indicates emissivity of the surface of the housing, while Qv indicates the required ventilation flow quantity. The unit of length is the millimeter, the unit of temperature is the Centigrade degree, and the unit of flow quantity is $m^3/s$.

The corresponding electric power value for the amount of heat emitted by convection from the surface of the housing is computed by the first term of this expression. The corresponding electric power value for the amount of heat emitted by radiation from the surface of the housing is computed by the second term of this expression. When the dimensions of the housing (G) to (I) are not all given, computation of the first term will be ignored. When the emissivity of the surface of the housing (F) is not known, the expression of the second term will be ignored. Accordingly, the expression to be used actually when only essential items are input is $P = 1150 \cdot Qv \cdot \Delta Ta$. From this expression, the required ventilation flow quantity Qv is obtained by dividing the total electric power consumption P by ($1150 \times \Delta Ta$).

Figure 5:
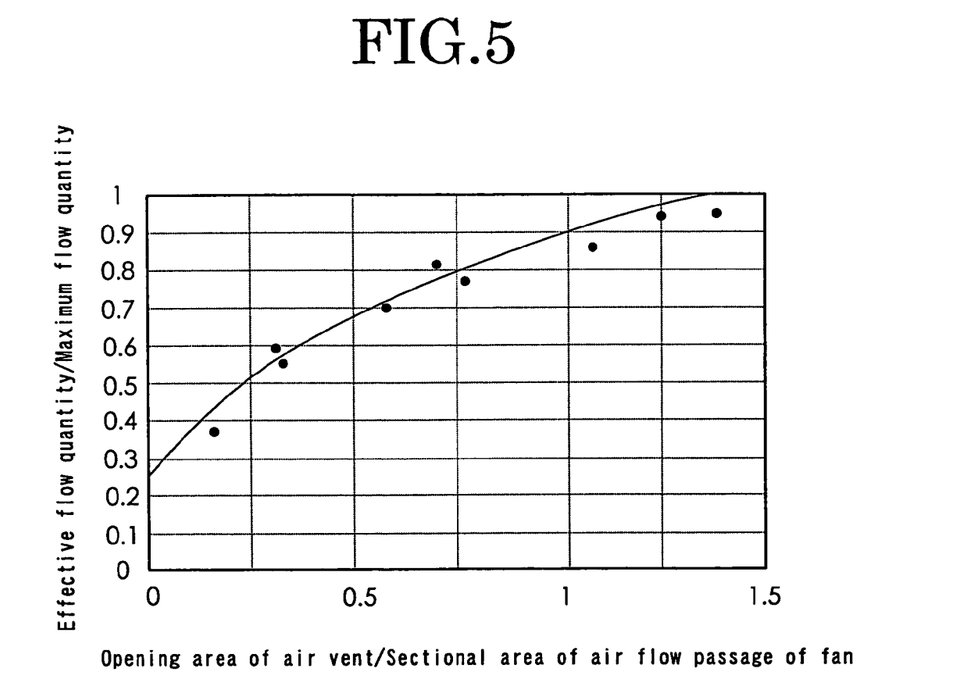
FIG. 5 is a graph showing an example of parameter data.

The parameter range determining means 5 obtains an area ratio $S_1/S_2$ between an opening area $S_1$(J) of an air vent provided at the housing planned for use and a sectional area $S_2$ of a fan planned for use, both input through the input means 1, and determines a parameter range of a proper flow quantity ratio necessary for cooling from this area ratio and parameter data stored in the parameter data storage means 6. In this embodiment, a square of the frame size which is the fan setting condition (D) is defined to be the sectional area of the air flow passage of the fan. The proper flow quantity ratio is obtained by dividing an effective flow quantity by a maximum flow quantity. "The air vent of the housing" is defined herein to be an "outside air inlet opening" or an "inside air discharge opening". When a fan mounting opening is provided at the housing and a fan for drawing outside air into the housing is mounted at the fan mounting opening, other air vent provided at the housing except for the fan mounting opening all become "inside air discharge openings." When a fan for discharging inside air outside the housing is mounted at the fan mounting opening, other air vent provided at the housing except for the fan mounting opening all become "outside air inlet openings." Further, to be more accurate, the "sectional area of the air flow passage of a fan" is defined to be the sectional area of an airflow channel around which an impeller with rotating blades rotates. Alternatively, the sectional area of the frame of the fan may be the sectional area of the air flow passage of this fan. The parameter data is the data that shows a change in the flow quantity ratio between an effective flow quantity $Q_1$ when a fan is operated and a maximum flow quantity $Q_0$ of the fan in a case where the area ratio $S_1/S_2$ between the opening area $S_1$ of the air vent provided at the housing and the sectional area $S_2$ of the air flow passage of the fan is changed. FIG. 5 shows one example of the parameter data that has been plotted. The parameter data as shown in FIG. 5 is stored in the parameter data storage means 6.

Between the area ratio of the opening area $S_1$ of the air vent of the housing to the sectional area $S_2$ of the air flow passage of the fan and the flow quantity ratio of the effective flow quantity $Q_1$ (flow quantity at which actual air blowing can be performed) when a fan is operated to the maximum flow quantity $Q_0$ (maximum flow quantity that can be achieved by performance of the fan), there is a relative relationship as shown in FIG. 5, regardless of the size of the housing. In other words, the more the area ratio becomes, the larger the flow quantity ratio becomes. The smaller the area ratio becomes, the smaller the flow quantity ratio becomes. Then, in the present invention, by utilizing this relationship, fan selection is made possible, without performing complicated computation and without preparing much fan data. Incidentally, referring to FIG. 5, an area with an area ratio ranging from zero to 0.25 is set to an area 1, an area with an area ratio ranging from 0.25 to 0.5 is set to an area 2, and an area with an area ratio ranging from 0.5 to 0.75 is set to area 3, and an area with an area ratio ranging from 0.75 to 1.25 is set to an area 4. Then, according to upper limit flow quantity value and a lower limit flow quantity value respectively corresponding to an upper limit area ratio value and a lower limit area ratio value of each of these areas, the parameter range of the proper flow quantity ratio described above is determined. The parameter ranges of the proper flow quantity ratio for the areas 1 to 4 can be determined as follows, for example.

Area 1 with large load: parameter range of flow quantity ratio ranging from 0.35 to 0.5

Area 2 with rather large load: parameter range of flow quantity ratio ranging from 0.5 to 0.667

Area 3 with standard load: parameter range of flow quantity ratio ranging from 0.667 to 0.75

Area 4 with light load: parameter range of flow quantity ratio ranging from 0.75 to 0.95

This area with the area ratio is set so that the parameter range of the proper flow quantity ratio required for cooling is determined in view of the maximum flow quantity of fans targeted for use.

The required flow quantity computing means 7 computes a required minimum flow quantity $Q_{min}$ by dividing a required ventilation flow quantity $Q_v$ by an upper limit value (PM2) of the parameter range of the proper flow quantity (from PM1 to PM2) determined by the parameter range determining means 5 and computes a required maximum flow quantity $Q_{max}$ by dividing the required ventilation flow quantity $Q_v$ by the lower limit value (PM1) of the parameter range of the proper flow quantity.

Figure 6:
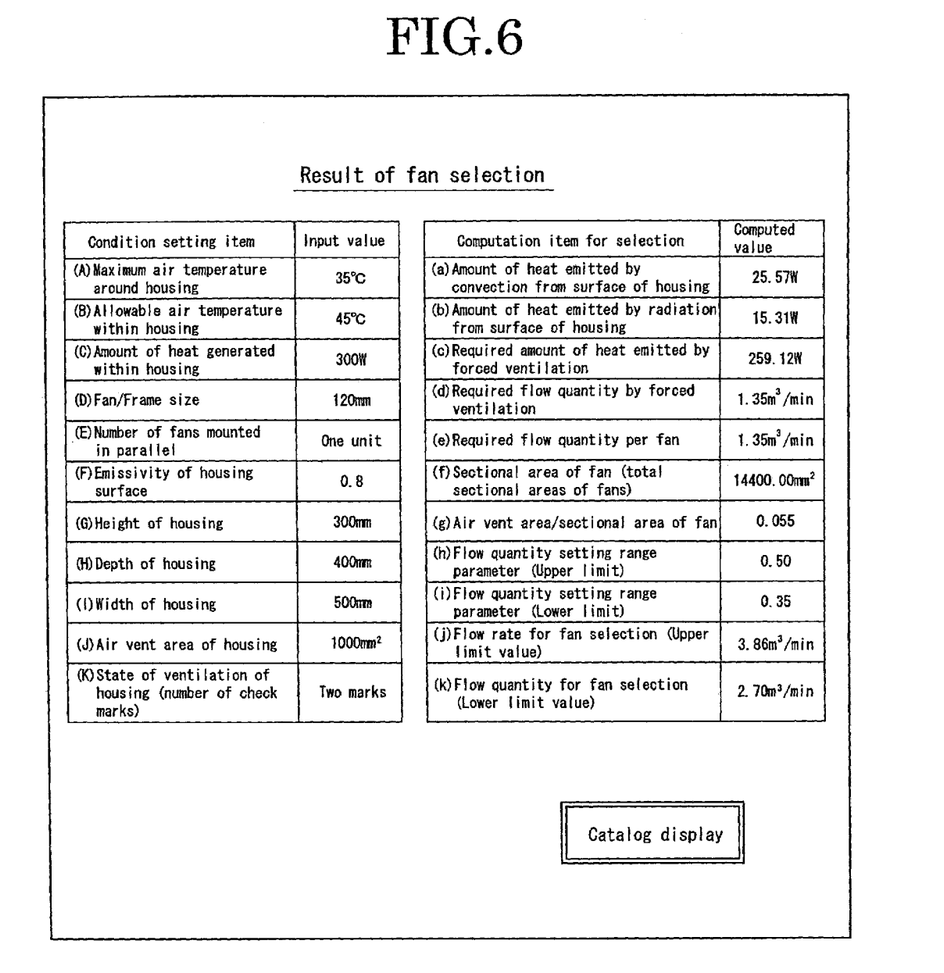
FIG. 6 is a table showing an example of a result of fan selection displayed on the display means.
Figure 7:
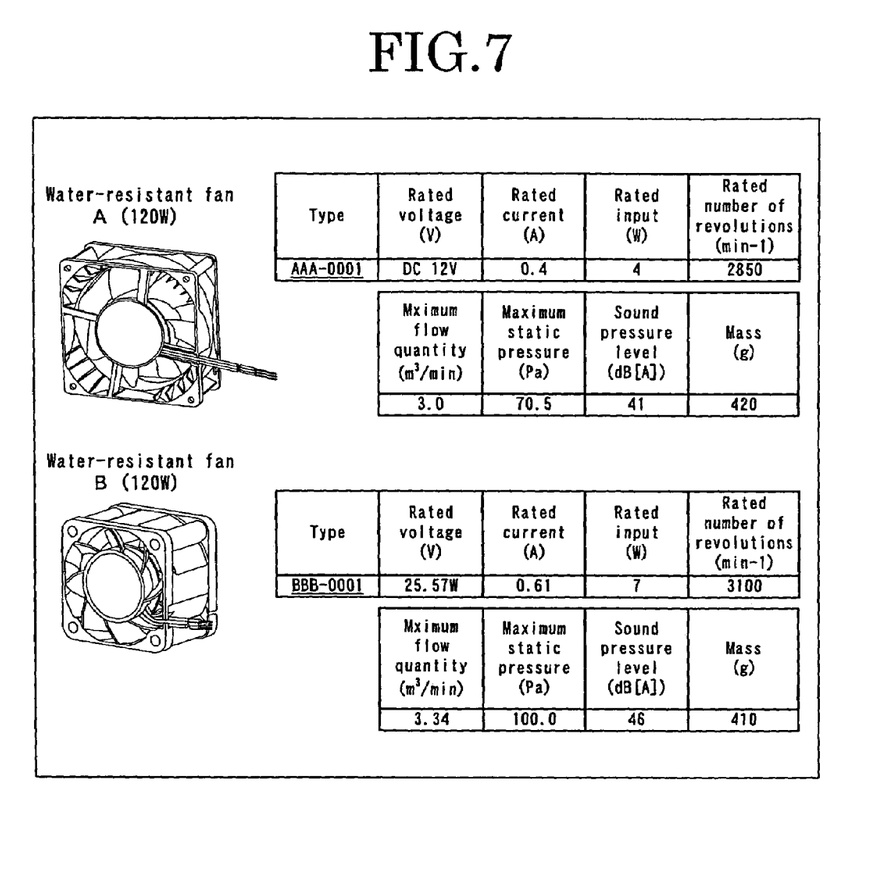
FIG. 7 is a diagram showing an example of a catalog displayed on the display means.
Figure 8:
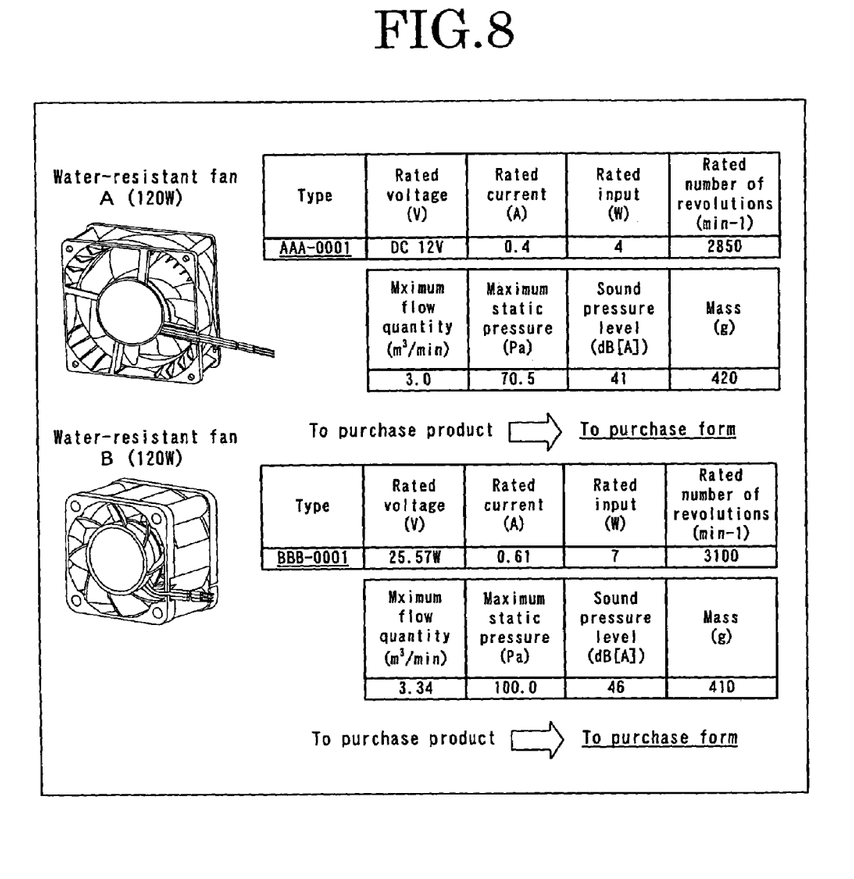
FIG. 8 is a diagram showing an example in which a selection display leading to a purchase form is listed on the catalog for a selected fan.

Then, the selection means 8 searches for a fan that generates the maximum flow quantity $Q_o$ necessary for obtaining the flow quantity that falls between the required minimum flow quantity $Q_{min}$ and the required maximum flow quantity $Q_{max}$, which have been computed by the required flow quantity computing means 7, from the database 9, and selects the fan as the necessary fan. When the number of fans is n, the maximum flow quantity $Q_o$ will be obtained from the maximum flow quantity of the fans multiplied by the number of the fans. Accordingly, the maximum flow quantity of each of selected fans satisfies a relation of $Q_{min}/n$<maximum flow quantity<$Q_{max}/n$. In the database 9, the fan data including the maximum flow rates $Q_o$ of the usable fans of a plurality of types, display data, and the like are stored. FIG. 6 shows an example of a result of fan selection. In the result of the fan selection in FIG. 6, characteristics of a selected fan are displayed. Then, in this example, when an icon for catalog display in FIG. 6 is clicked, a catalog in FIG. 7 is displayed. Fans shown in the catalog of FIG. 7 becomes the fans that can be actually used. FIGS. 6 and 7 are display forms for fan selection alone. When the form in FIG. 7 is used for selection of a fan and then purchase of the fan, selection display leading to a purchase form may be displayed on the catalog of the selected fan, as shown in FIG. 8.

Figure 9:
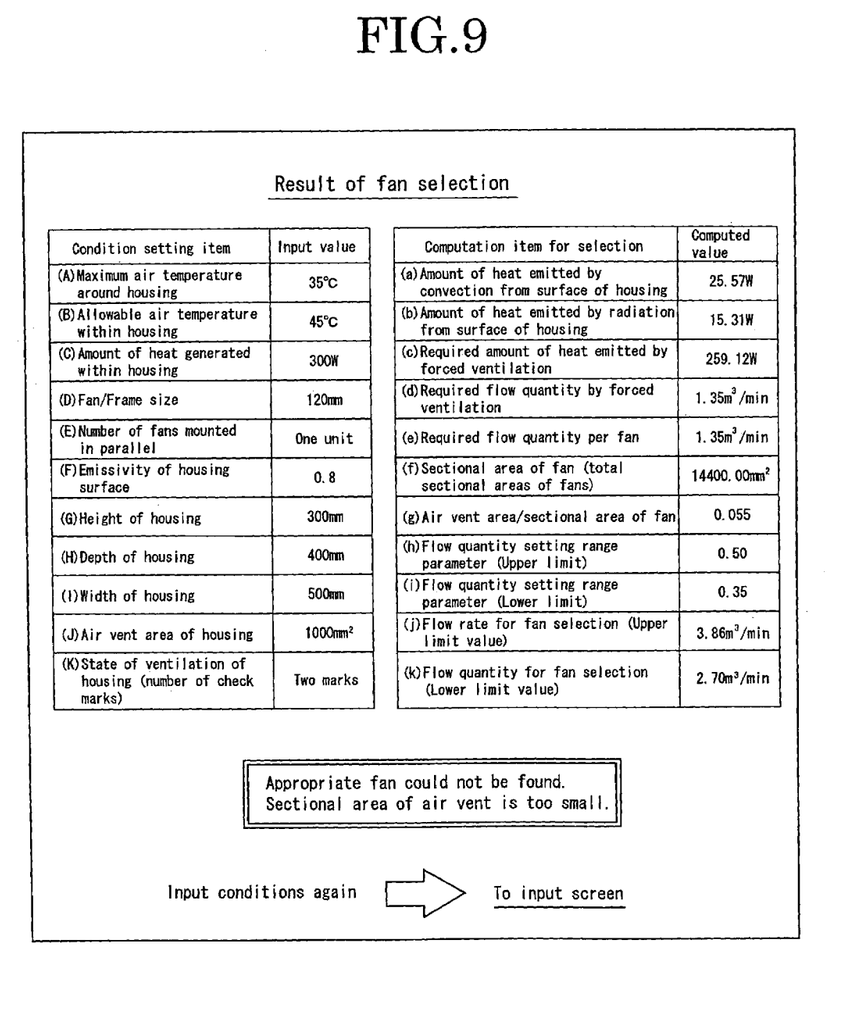
FIG. 9 is a table showing a display example in which selection of an appropriate fan cannot be performed.

When a fan that satisfies conditions listed in the result of the fan selection is not present in the registered fans in the database 9 as a result of computations, conditions for the fan selection and conditions to be satisfied by the selected fan are displayed, as shown in FIG. 9. A reason why an appropriate fan cannot be selected is also displayed. By displaying this reason, it becomes easy to change the conditions and perform another fan selection.

Figure 10:
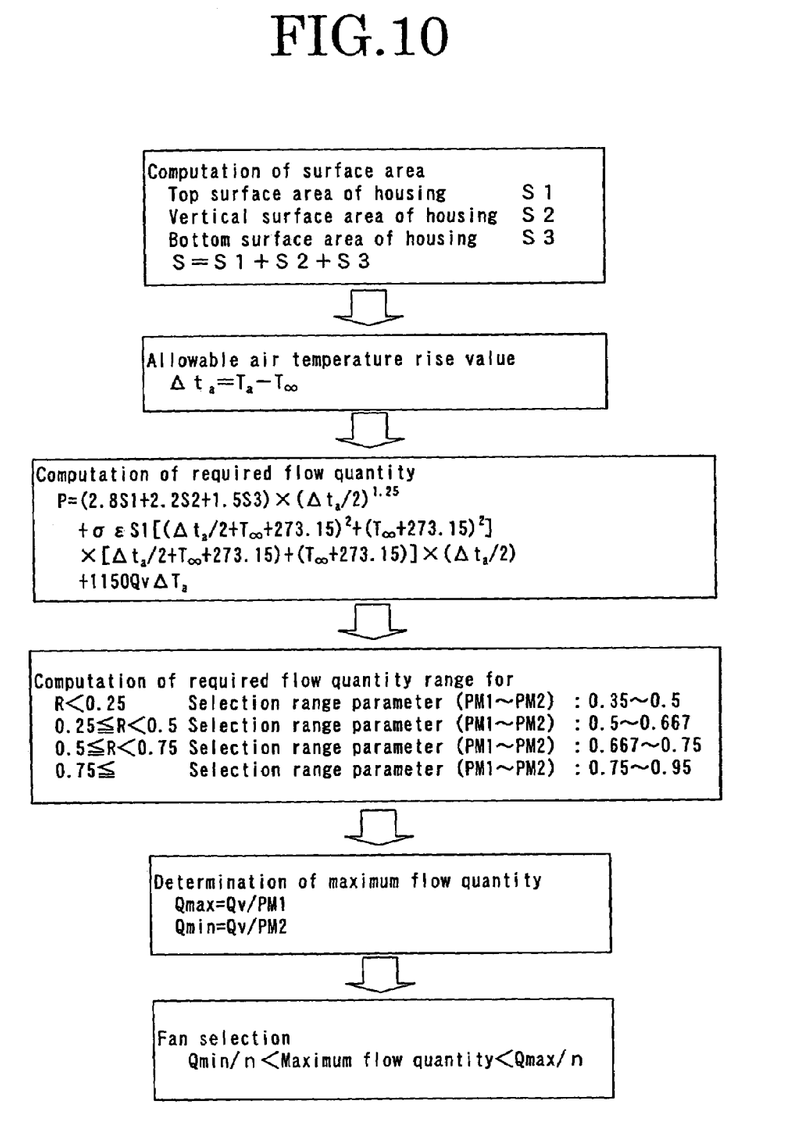
FIG. 10 is a diagram showing contents of computations and a flow of the computations actually implemented in the embodiment of the present invention.

FIG. 10 is a diagram showing contents of the computations and a flow of the computations actually executed in the embodiment. In order to facilitate display in FIG. 10, reference numerals indicating surface areas of respective portions of the housing are changed to reference numerals S1 to S3 different from those in the above description, and expressed. Reference character R denotes an area ratio.

When the area ratio between the opening area of the air vent provided at the housing planned for use and the sectional area of the air flow passage of a fan planned for use is unknown by input through the input means 1, the parameter range determining means 5 is assumed to use a predetermined standard parameter range. This standard parameter range is determined with reference to general design criteria. The lower limit value PM1 is set to 0.66, while the upper limit value PM2 is set to 0.75.

In this embodiment, the parameter range determining means 5 determines the parameter range in view of a state of ventilation (K) of the housing shown in FIG. 4. Specifically, a state of good ventilation within the housing planned for use is set to a coefficient of 1. When the state of ventilation becomes worse, the coefficient is reduced. Then, based on a value obtained by multiplying the coefficient by the area ratio according to the state of ventilation, a proper flow quantity ratio range is determined. In this embodiment, three adverse conditions that deteriorate the state of ventilation within the housing planned for use are listed in advance. Then, according to how many adverse conditions of the three are included in the housing, the level of ventilation in the housing is determined. In this embodiment, the coefficient is changed according to the number of check marks in check boxes in the field of the state of ventilation (K) of the housing. When a check mark indicating one adverse condition is entered, the coefficient is set to 0.9, which is obtained by subtracting 0.1 from 1. When two check marks indicating two adverse conditions are entered, the coefficient is set to 0.8, which is obtained by subtracting 0.1×2 from 1. The coefficient is thus reduced according to the state of ventilation. With this arrangement, the computations can be performed in view of the state of ventilation. Accordingly, accuracy of the computations can be increased.

In the fan selection method of the present invention implemented in the embodiment described above, a preparation step, a computing step, a parameter range determining step, a determination step, a selection step, and a notification step are performed. First, at the preparation step, the parameter data storage means 6 and the database 9 in FIG. 2 are prepared. The computing step is the step operated by the computing means 4 in FIG. 2. As seen from the flowchart of the program shown in FIG. 3, this step is performed at step ST3. Then, the parameter range determining step is the step operated by the parameter range determining means 5 in FIG. 2. As seen from the flowchart of the program shown in FIG. 3, this step is performed at steps ST4 through ST6. Further, the selection step is the step operated by the required flow quantity computing means 7 and the selection means 8 in FIG. 2. As seen from the flowchart of the program shown in FIG. 3, this step is performed at steps ST7 through ST9. Then, the notification step is performed at step ST10. This step ST10 constitutes the notification means.

In the embodiment described above, a configuration in which the personal computers PC constituting a plurality of terminal devices can access the server SC using the network is adopted. However, the fan selection device according to the present invention may be of course implemented using one dedicated computer.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A fan selection method for selecting a fan required for cooling an inside space of a housing including therein an electric device that generates heat, said method comprising:

providing a database comprising fan data including a maximum flow quantity $Q_0$ of each of usable fans of a plurality of types, and parameter data, the parameter data indicating a change in a flow quantity ratio between an effective flow quantity $Q_1$ and the maximum flow quantity $Q_0$ of the fan when an area ratio $S_1/S_2$ of an opening area $S_1$ of an air vent provided at said housing to a sectional area $S_2$ of an air flow passage at the fan is changed, the effective flow quantity $Q_1$ indicating the flow quantity when the fan is operated;

computing a required ventilation flow quantity by entering into a computational expression a predicted total electric power consumption of said electric device and a predicted rise in air temperature within said housing, said computational expression indicating a relation among the predicted total electric power consumption of said electric device, the predicted rise in an air temperature within said housing when cooling is not performed, and the required ventilation flow quantity necessary for the cooling;

determining an area ratio $S_1/S_2$ between the opening area $S_1$ of said air vent provided at said housing planned for use and the sectional area $S_2$ of the air flow passage of the fan planned for use, and determining from the area ratio $S_1/S_2$ and the parameter data a parameter range of a proper flow quantity ratio required for the cooling; and selecting from said database a fan as said fan required for cooling that produces the maximum flow quantity $Q_0$ necessary for obtaining a flow quantity that falls between a required minimum flow quantity $Q_{min}$ and a required maximum flow quantity $Q_{max}$, the required minimum flow quantity $Q_{min}$ being obtained by dividing the required ventilation flow quantity by an upper limit value of the parameter range of the proper flow quantity ratio, the required maximum flow quantity $Q_{max}$ being obtained by dividing the required ventilation flow quantity by a lower limit value of the parameter range of the proper flow quantity ratio.

2. The fan selection method according to claim 1, wherein at the computing, at least one of a corresponding electric power value for an amount of heat emitted by convection from a surface of said housing planned for use and a corresponding electric power value for an amount of heat emitted by radiation from said surface of said housing is added to an electric power converted value obtained by converting an amount of heat to be cooled by the fan to electric power, the corresponding electric power value for the amount of heat emitted by convection being obtained by converting the amount of heat emitted by convection to electric power, the corresponding electric power value for the amount of heat emitted by radiation being obtained by converting the amount of heat emitted by radiation to electric power.

3. The fan selection method according to claim 1, wherein, in the parameter range determining, a state of good ventilation within said housing planned for use is set to a coefficient of 1, the coefficient is reduced when the state of ventilation becomes worse, and the parameter range of the proper flow quantity ratio is determined based on a value obtained by multiplying the coefficient by the area ratio $S_1/S_2$ according to the state of ventilation.

4. The fan selection method according to claim 1, wherein in the parameter range determining, when the area ratio $S_1/S_2$ between the opening area $S_1$ of said air vent provided at said housing planned for use and the sectional area $S_2$ of the air flow passage of the fan planned for use is unknown, a parameter range that is predetermined as standard is used.

5. The fan selection method according to claim 1 further comprising:

notifying a reason that an appropriate fan cannot be selected at the selection step when an appropriate fan cannot be selected.

6. A fan selection device for selecting a fan required for cooling an inside space of a housing including therein an electric device that generates heat, said device comprising:

parameter data storage means for storing parameter data indicating a change in a flow quantity ratio between an effective flow quantity $Q_1$ and a maximum flow quantity $Q_0$ of the fan when an area ratio $S_1/S_2$ of an opening area $S_1$ of an air vent provided at said housing to a sectional area $S_2$ of an air flow passage at the fan is changed, the effective flow quantity $Q_1$ indicating the effective flow quantity when the fan is operated;

a database comprising fan data including the maximum flow quantity $Q_0$ of each of usable fans of a plurality of types;

input means for inputting a condition for the selection;

computing means for computing a required ventilation flow quantity when a predicted total electric power consumption of said electric device and a predicted rise in air temperature within said housing are entered into a computational expression, said computational expression indicating a relation among the predicted total electric power consumption of said electric device, the predicted rise in air temperature within said housing when cooling is not performed, and the required ventilation flow quantity necessary for the cooling;

parameter range determining means for obtaining the area ratio $S_1/S_2$ between the opening area $S_1$ of said air vent provided at said housing planned for use and the sectional area $S_2$ of the air flow passage of the fan planned for use, and determining from the area ratio $S_1/S_2$ and the parameter data a parameter range of a proper flow quantity ratio required for the cooling;

required flow quantity computing means for computing a required minimum flow quantity $Q_{min}$ and a required maximum flow quantity $Q_{max}$, the minimum required flow quantity $Q_{min}$ being obtained by dividing the required ventilation flow quantity by an upper limit value of the parameter range of the proper flow quantity, the maximum required flow quantity $Q_{max}$ being obtained by dividing the required ventilation flow quantity by a lower limit value of the parameter range of the proper flow quantity; and selection means for selecting from said database a fan as said fan required for cooling that produces the maximum flow quantity $Q_0$ necessary for obtaining a flow quantity that falls between the required minimum flow quantity $Q_{min}$ and the required maximum flow quantity $Q_{max}$, computed by said required flow quantity computing means.

7. The fan selection device according to claim 6, wherein said computing means uses at least one of a corresponding electric power value for an amount of heat emitted by convection from a surface of said housing planned for use and a corresponding electric power value for an amount of heat emitted by radiation from said surface of said housing added to a electric power converted value obtained by converting an amount of heat to be cooled by the fan to electric power, the corresponding electric power value for the amount of heat emitted by convection being obtained by converting the amount of heat emitted by convection to electric power, the corresponding electric power value for the amount of heat emitted by radiation being obtained by converting the amount of heat emitted by radiation to electric power.

8. The fan selection device according to claim 6, wherein said parameter range determination means sets a state of good ventilation within said housing planned for use to a coefficient of 1, reduces the coefficient when the state of ventilation becomes worse, and determines the parameter range of the proper flow quantity ratio based on a value obtained by multiplying the coefficient by the area ratio $S_1/S_2$ according to the state of ventilation.

9. The fan selection device according to claim 6, wherein said parameter range determination means uses a parameter range that is predetermined as standard when the area ratio $S_1/S_2$ between the opening area $S_1$ of said air vent provided at said housing planned for use and the sectional area $S_2$ of the air flow passage of the fan planned for use is unknown.

10. The fan selection device according to claim 6, further comprising notification means for notifying a reason that an appropriate fan cannot be selected by said selection means when an appropriate fan cannot be selected.

11. A computer executable program stored in a computer readable medium for selecting a fan required for cooling an inside space of a housing including therein an electric device that generates heat, said program causing said computer to perform a method of:

providing parameter data in a database comprising fan data, the parameter data indicating a change in a flow quantity ratio between an effective flow quantity $Q_1$ and a maximum flow quantity $Q_0$ of the fan when an area ratio $S_1/S_2$ of an opening area $S_1$ of an air vent provided at said housing to a sectional area $S_2$ of an air flow passage at the fan is changed, the effective flow quantity $Q_1$ indicating the effective flow quantity when the fan is operated, the fan data including a maximum flow quantity $Q_0$ of each of usable fans of a plurality of types;

computing a required ventilation flow quantity by entering into a computational expression a predicted total electric power consumption of said electric device and a predicted rise in air temperature within said housing, said computational expression indicating a relation among the predicted total electric power consumption of said electric device, the predicted rise in air temperature within said housing when cooling is not performed, and the required ventilation flow quantity necessary for the cooling;

obtaining the area ratio $S_1/S_2$ between the opening area $S_1$ of said air vent provided at said housing planned for use and the sectional area $S_2$ of the air flow passage of the fan planned for use, and determining from the area ratio $S_1/S_2$ and the parameter data a parameter range of a proper flow quantity ratio required for the cooling; and selecting as the fan required for cooling a fan from said database that produces the maximum flow quantity $Q_0$ necessary for obtaining a flow quantity that falls between a required minimum flow quantity $Q_{min}$ and a required maximum flow quantity $Q_{max}$, the required minimum flow quantity $Q_{min}$ being obtained by dividing the required ventilation flow quantity by an upper limit value of the parameter range of the proper flow quantity ratio, the required maximum flow quantity $Q_{max}$ being obtained by dividing the required ventilation flow quantity by a lower limit value of the parameter range of the proper flow quantity ratio.

* * * * *